INVENTOR.
GERALD B. HERZOG
BY
W. H. Sprougle
ATTORNEY

United States Patent Office 3,408,592

Patented Oct. 29, 1968

3,408,592

TRANSISTOR-NEGATIVE RESISTANCE DIODE CIRCUITS USING D.C. FEEDBACK

Gerald B. Herzog, Princeton, N.J., assignor to Radio Corporation of America, a corporation of Delaware Filed Apr. 19, 1961, Ser. No. 104,165
9 Claims. (Cl. 331—8)

This ivention relates to electrical circuits, and more particularly to wave generating circuits for producing recurrent signal waveforms.

An electrical circuit, such as a wave generating circuit, in accordance with the invention includes a transistor and a voltage controlled negative resistance diode, such as a tunnel diode. The diode is connected to the signal input electrode of the transistor and poled so that the transistor is cut-off when the diode is in its low voltage state and is conducting when the diode is in its high voltage state. The output electrode of the transistor is connected to the negative resistance diode to apply a signal to the diode to switch it between its high and low voltage states in response to signals on the output electrode of transistor.

A suitable control signal, such as derived from a phase detector responsive to the output signal of the wave generating circuit, may be utilized to additionally bias the negative resistance diode and provide an automatic control of the frequency of the output signals from the circuit.

The invention may be more fully understood when the following detailed description is read in connection with the accompanying drawings, in which.

Figures 1, 2:
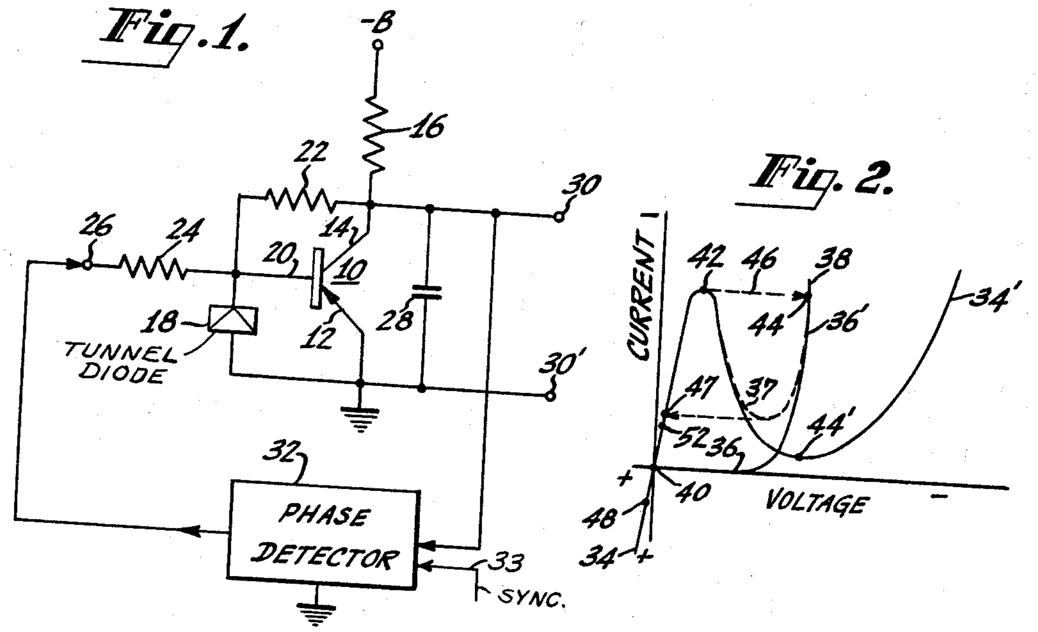
FIGURE 1 is a schematic circuit diagram of a wave generating circuit in accordance with the invention.
FIGURE 2 is a graph showing curves illustrating certain operational features of the circuit of FIGURE 1.

The wave generating circuit shown in FIGURE 1 includes a transistor 10 having an emitter electrode 12 connected to ground, or a point of reference potential, for the circuit, and having a collector electrode 14, used as an output electrode, connected through a collector resistor 16 to a source of operating potential,—B. The transistor 10 is illustrated as a PNP transistor and the operating potential, —B, is thus negative with respect to ground. A tunnel diode 18 has its cathode connected to the base or input electrode 20 of the transistor 10 and its anode connected to the emitter electrode 12. A feedback resistor 22 is connected between the collector 14 and the base 20, and the base 20 is also connected through a resistor 24 to a control voltage input terminal 26. A charging capacitor 28 is connected directly between the collector 14 and emitter 12. Output signals from the wave generating circuit are derived directly between the collector 14 and emitter 12 and appear at a pair of output terminals 30 and 30', with the output 30 connected to the collector 14 and the terminal 30' connected directly to ground.

Output signals at the collector 14 are also applied directly from the collector 14 to a phase detector 32, the function of which will be explained hereinafter.

To simplify the description, the operation of the circuit will be described, initially, assuming that the phase detector 32 is not connected in the circuit.

When the operating voltage, —B, is applied to the circuit, the voltage across the tunnel diode 18 is initially zero placing a zero bias between the emitter 12 and base 20 of the transistor 10 and biasing the transistor 10 to a cut-off condition where no current flows between collector 14 and emitter 12. This condition is best illustrated by the graph of FIGURE 2, in which the curve 34–34' is a plot of the current-voltage characteristics of the tunnel diode 18, and the curve 36–36' is a plot of the current-voltage characteristics of the base-to-emitter path of the transistor 10. Because the tunnel diode 18 and the base-to-emitter path are connected in parallel, the composite characteristic of the two is obtained by adding the two curves 34–34' and 36–36'. The resultant composite characteristic is shown as the partially dashed curve 34–37–38. The initial zero voltage across the tunnel diode 18 is shown as point 40 on the composite curve 34–37–38, indicating the low voltage state of the tunnel diode.

Because at the initial condition described the transistor 10 is cut-off, the capacitor 28 begins to charge relatively slowly toward the —B voltage through the collector resistor 16. As the voltage across the charging capacitor 28, and hence at the collector 14, begins to build up in a negative direction, current flows through the tunnel diode 18 and the feedback resistor 22. The current through the tunnel diode thus begins to increase from the operating point 40 along the composite curve 34–37–38 toward the peak value of the tunnel diode current, which is shown by point 42 on the composite curve 34–37–38. When the peak current value point 42 is reached, the operating point switches from point 42 to point 44 on the composite curve 34–37–38 along some line such as the dashed line 46. The tunnel diode 18 is therefore in its high voltage state which as represented by the vertical projection of the operating point 44 on the tunnel diode characteristic 34–34', that is, point 44'.

With the tunnel diode 18 then in its high voltage state it biases the transistor 10 into conduction. This conduction discharges the capacitor 28 relatively rapidly through the relatively low impedance internal collector-to-emitter path of the transistor 10. The rapid discharge of the capacitor 28 drives the voltage on the collector 14 towards zero, thereby reducing the voltage across the tunnel diode 18 toward zero along the line 36'–47–40 of FIGURE 2. When the voltage across the tunnel diode 18 nears zero the tunnel diode is in its low voltage state and the base-to-emitter bias of the transistor 10 is reduced to near zero cutting off the transistor 10 and preventing further current conduction in its collector-to-emitter path. At this time the capacitor 28 begins charging again through the collector resistor 16 to repeat the cycle.

Figure 3:
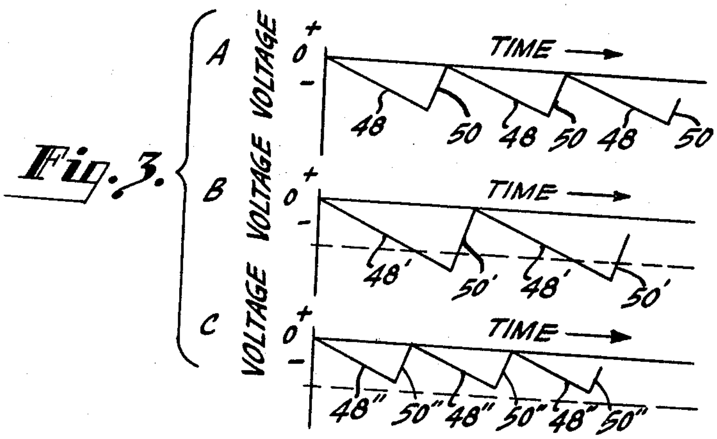
FIGURE 3 is a graph showing curves illustrating output signals that may be derived from the circuit of FIGURE 1.

The output waveform from the circuit of FIGURE 1 is shown in FIGURE 3A, which is a plot of the output voltage appearing at the terminals 30–30' against time. The downward sloping portions 48 of the curves shown in FIGURE 3A represent the charging of the capacitor 28 while the tunnel diode 18 is in its low voltage state, that is, during the time required for the operating point of the tunel diode 18 to move from point 40 to point 42 on the composite curve 34–37–38 shown in FIGURE 2. The upward sloping portions 50 of the curves shown in FIGURE 3A represent the discharge time of the capacitor 28 while the tunnel diode 18 is in its high voltage state, that is, during the time required for the operating point of the tunnel diode to switch from point 42 through point 44 and back to point 40 on the line 36'–47–40 shown in FIGURE 2.

The circuit of the invention lends itself readily to automatic frequency control of the output signal. If, for instance, a positive direct voltage is applied to the control terminal 26 from a source, such as phase detector 32, the tunnel diode 18 is initially biased in the reverse direction, the initial operating point is shifted from point 40 to point 48 on the composite curve 34–37–38 of FIG- URE 2. Thus, the charging time of the capacitor 48 required to reach the peak current point 42 of the tunnel diode 18 is increased, since a larger voltage between the collector 14 and ground is now needed to drive the tunnel diode 18 to its peak current point 42. Since the capacitor 28 must now charge for a longer time, a decrease in the frequency of the output signal results as shown in FIGURE 3B. The downward sloping portions 48′ of FIGURE 3B again represent the charging of capacitor 28 and the upward sloping portions 50′ represent the capacitor discharge. Note that the peak value of the voltage appearing at the collector 14 must become more negative to overcome the initial reverse bias at the control terminal 26 to cause the tunnel diode 18 to switch so as to discharge the capacitor 28 through the transistor 10.

If, on the other hand, a negative direct control voltage is applied to the control terminal 26, the opposite action occurs. In this case the tunnel diode 18 is biased in the forward direction and its initial operating point is shifted from point 40 in FIGURE 2 to a point such as 52 on the combined characteristic 34–37–38. A smaller than normal voltage on the collector 14 will drive the tunnel diode 18 to its peak current point 42 and initiate the action previously described to discharge the capacitor 28. This is illustrated in FIGURE 3C, in which the downward sloping portions 38″ represent the charging of capacitor 28 and upward sloping portions 50″ represent the capacitor discharge. Note that the frequency of the recurrent waveform is increased while its amplitude is decreased.

The frequency of the circuit is automatically controlled by the phase detector 32 which receives as an input signal the output waveform available across the capacitor 28. The phase detector 32 may be of well known design to provide a positive output signal when the frequency of the output wave is greater than desired and a negative output signal when the frequency of the output signal is lower than desired.

As is also well known, the frequency and/or phase of the output signal may also be compared in the phase detector 32 with an external synchronizing signal (shown as applied to phase detector 32 via lead 33) as, for instance, in presently available commercial television receivers.

A practical circuit constructed in accordance with the invention may have typical values as follows:

| | | |
|---|---|---|
| Operating voltage, —B | volts | —28 |
| Resistor **16** | ohms | 10,000 |
| Resistor **22** | do | 10,000 |
| Resistor **24** | do | 10,000 |
| Capacitor **28** | microfarad | 0.015 |
| Transistor **10** | | Type 2N109 |
| Tunnel diode **18** | | (1) |

(1) Germanium tunnel diode having a peak current of 2.5 milliamperes.

With the circuit values shown and with the circuit free running (that is with the voltage at the control terminal 26 equal to zero) the frequency of the output saw-tooth signal is 15.4 kilocycles. Values of the frequency of the output signal for various control voltages are as follows:

| Control voltage: | Frequency, kilocycles |
|---|---|
| +1.35 | 11.3 |
| +1.25 | 12.0 |
| +1.0 | 13.3 |
| +0.5 | 14.5 |
| +0 | 15.4 |
| +0.25 | 15.9 |
| —0.5 | 16.4 |
| —0.75 | 16.7 |
| —1.0 | 17.0 |
| —1.5 | 17.6 |
| —2.0 | 17.8 |
| —2.5 | 18.2 |

While a type PNP transistor has been illustrated in the circuit of FIGURE 1, it is to be understood that the circuit may be operated in the same manner using an NPN transistor requiring only a reversal in polarity of the operating voltage and a reversal in the connection of the tunnel diode 18, that is, its anode is connected to the base 20 of the transistor 10 and its cathode to the emitter 12.

I claim:

1. The combination comprising a transistor having input, output and common electrodes, a negative resistance diode of the voltage-controlled type having high and low voltage states connected between said input electrode and said common electrode in a polarity to maintain said transistor cut-off when said diode is in said low voltage state and to cause conduction in said transistor when said diode is in said high voltage state, means including an impedance for coupling a source of unidirectional voltage between said output and said common electrodes, and a direct current feedback connection means between said output electrode and said input electrode to switch said diode between said high and low voltage states.

2. The combination comprising a transistor having base, emitter, and collector electrodes, a tunnel diode connected between said base and emitter electrodes in a polarity to maintain said transistor cut-off when said diode is in a low voltage state and to cause conduction in said transistor when said diode is in a high voltage state, means including an impedance for applying an energizing unidirectional potential to said collector electrode, and direct current feedback means connected from said collector electrode to said diode to switch said diode between said high and low voltage states in response to the voltage on said collector electrode.

3. The combination comprising a transistor having base, emiter, and collector electrodes; biasing means for said transistor including a negative resistance diode of the voltage controlled type having high and low voltage states connected between said base and emitter electrodes and poled to maintain said transistor cut-off when said diode is in said low voltage state and to cause conduction in said transistor when said diode is in said high voltage state; means including a resistor for applying and operating voltage to said collector electrode; direct current feedback means connected between said collector electrode and said diode to switch said diode between said high and low voltage states in response to the voltage of said collector electrode, said feedback means including a feedback resistor for controlling the amount of direct current back; and a reactive element associated with said collector electrode for controlling the time of application of said direct current feedback.

4. A wave generating circuit comprising in combination a transistor having base, emitter and collector electrodes, a negative resistance diode of the voltage controlled type connected between said emitter and base electrodes and poled to cut-off said transistor when said diode is in a low voltage state and to cause conduction in said transistor when said diode is in a high voltage state, means including a first resistor for applying an operating voltage to said collector electrode, a capacitor connected between said collector and emitter electrodes, feedback means including a second resistor connected between said collector and base electrodes for switching said diode between its high and low voltage states in response to the voltage on said collector electrode, and means for deriving an output signal from said collector electrode.

5. A wave generating circuit comprising in combination a transistor having base, emitter and collector electrodes, a negative resistance diode of the voltage controlled type connected between said emitter and base electrodes and poled to cut-off said transistor when said diode is in a low voltage state and to cause conduction in said transistor when said diode is in a high voltage state, means including a first resistor for applying an operating voltage to said collector electrode, a capacitor connected between said collector and emitter electrodes, feedback means including a second resistor connected between said collector and base electrodes for switching said diode between its high and low voltage states in response to the voltage on said collector electrode, means for deriving an output signal from said collector electrode, phase detector means having an input circuit and an output circuit for developing a control voltage in said output circuit in response to a signal applied to said input circuit, means for applying the output signal from said collector electrode to said input circuit, and means for connecting the output circuit of said phase detector means to said diode to control the frequency of the output signal from said collector electrode.

6. A sawtooth wave generating circuit comprising in combination a transistor having base, emitter and collector electrodes, bias means including a negative resistance diode of the voltage controlled type having high and low voltage states connected between said emitter and base electrodes and poled to cut-off collector-to-emitter current in said transistor when said diode is in said low voltage state and to cause collector-to-emitter current conduction in said transistor when said diode is in said high voltage state, a source of operating voltage for said circuit, circuit means including a resistor for applying voltage derived from said source of operating voltage to said collector electrode, a charging capacitor connected between said collector and emitter electrodes, feedback means including a resistor connected between said collector and base electrodes for switching said diode between its high and low voltage states in response to the voltage on said collector electrode, and means for deriving an output signal from said collector electrode.

7. A sawtooth wave generating circuit comprising in combination a transistor having base, emitter and collector electrodes, bias means including a negative resistance diode of the voltage controlled type having high and low voltage states connected between said emitter and base electrodes and poled to cut-off collector-to-emitter current in said transistor when said diode is in said low voltage state and to cause collector-to-emitter current conduction in said transistor when said diode is in said high voltage state, a source of operating voltage for said circuit, circuit means including a resistor for applying voltage derived from said source of operating voltage to said collector electrode, a charging capacitor connected between said collector and emitter electrodes, feedback means including a resistor connected between said collector and base electrodes for switching said diode between its high and low voltage states in response to the voltage on said collector electrode, means for deriving an output signal from said collector electrode, phase detector means having an input circuit and an output circuit for developing a control voltage in said output circuit in response to a signal applied to said input circuit, means for applying said output signal from said collector electrode to said input circuit, and means for connecting the output circuit of said phase detector means to said diode to apply said control voltage to said diode to control the frequency of said output signal from said collector electrode.

8. An oscillator comprising: a transistor; means including a voltage responsive bistable negative resistance device for biasing said transistor successively in conductive and non-conductive states; an energy storage device connected to said biasing means; means for charging said energy storage device over a preselected interval to a voltage which causes said voltage responsive bistable resistance device to bias said transistor in said conductive state; an output circuit; and means interconnecting said energy storage device, said output circuit and said transistor, for rapidly discharging said energy storage device when said transistor is rendered conductive.

9. An oscillator comprising: a transistor; means including a tunnel diode for biasing said transistor successively in conductive and non-conductive states; an energy storage device connected to said biasing means; means for charging said energy storage device over a preselected interval to a voltage which causes said tunnel diode to bias said transistor in said conductive state; an output circuit; and means interconnecting said energy storage device, said output circuit and said transistor, for rapidly discharging said energy storage device when said transistor is rendered conductive.

References Cited

UNITED STATES PATENTS

| | | | |
|---|---|---|---|
| 2,766,380 | 10/1956 | Kroger | 331—8 |
| 3,094,630 | 6/1963 | Rapp et al. | 307—88.5 |
| 3,094,631 | 6/1963 | Davis | 307—88.5 |
| 3,102,209 | 8/1963 | Pressman | 307—88.5 |
| 3,116,459 | 12/1963 | Tiemann | 307—88.5 |

OTHER REFERENCES

Tunnel Diode Manual TK, 7872, S4G4, 1st edition, by General Electric Co., copyrighted Mar. 20, 1961, pp. 44–49.

Tunnel Diodes as Amplifiers and Switches, by Sylvan et al. in reprint of May 1960 issue of Electric Equipment Engineering, 7 pages.

JOHN KOMINSKI, *Primary Examiner.*

J. A. JORDAN, *Assistant Examiner.*